(12) United States Patent
Chen

(10) Patent No.: US 10,699,988 B2
(45) Date of Patent: Jun. 30, 2020

(54) CHIP PACKAGING METHOD AND PACKAGE STRUCTURE

(71) Applicant: Silergy Semiconductor Technology (Hangzhou) LTD, Hangzhou, ZheJiang Province (CN)

(72) Inventor: Shijie Chen, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 0 days.

(21) Appl. No.: 15/997,846

(22) Filed: Jun. 5, 2018

(65) Prior Publication Data

US 2018/0366393 A1 Dec. 20, 2018

(30) Foreign Application Priority Data

Jun. 19, 2017 (CN) .......................... 2017 1 0462318

(51) Int. Cl.
| | | |
|---|---|---|
| *H01L 23/495* | (2006.01) | |
| *H01L 25/065* | (2006.01) | |
| *H01L 23/31* | (2006.01) | |
| *H01L 23/538* | (2006.01) | |
| *H01L 23/13* | (2006.01) | |
| *H01L 23/04* | (2006.01) | |
| *H01L 23/24* | (2006.01) | |
| *H01L 23/498* | (2006.01) | |

(52) U.S. Cl.
CPC .......... *H01L 23/4951* (2013.01); *H01L 23/04* (2013.01); *H01L 23/13* (2013.01); *H01L 23/24* (2013.01); *H01L 23/3114* (2013.01); *H01L 23/4952* (2013.01); *H01L 23/49513* (2013.01); *H01L 23/49575* (2013.01); *H01L 23/5389* (2013.01); *H01L 25/0657* (2013.01); *H01L 23/49827* (2013.01); *H01L 2224/04105* (2013.01); *H01L 2224/19* (2013.01); *H01L 2224/73267* (2013.01); *H01L 2224/92244* (2013.01); *H01L 2924/15153* (2013.01)

(58) Field of Classification Search
None
See application file for complete search history.

(56) References Cited

U.S. PATENT DOCUMENTS

| | | | |
|---|---|---|---|
| 7,193,302 B2 | 3/2007 | Tseng | |
| 7,196,411 B2 | 3/2007 | Chang | |
| 8,836,093 B2 | 9/2014 | Tan | |
| 8,866,273 B2 | 10/2014 | Tan | |
| 9,024,440 B2 | 5/2015 | Tan | |
| 9,123,629 B2 | 9/2015 | Tan | |
| 9,373,567 B2 | 6/2016 | Tan | |
| 9,515,052 B1* | 12/2016 | Lee | ........... H01L 25/0657 |
| 2008/0217761 A1 | 9/2008 | Yang et al. | |
| 2009/0250809 A1* | 10/2009 | Yoshida | ........... H01L 23/367 257/723 |

(Continued)

*Primary Examiner* — Jack S Chen
(74) *Attorney, Agent, or Firm* — Michael C. Stephens, Jr.

(57) ABSTRACT

A method of forming a chip package structure can include: forming a substrate; forming a first cavity in the substrate; and installing a first chip in the first cavity. The method can also include forming a second cavity in the substrate; and installing a second chip in the second cavity. The first cavity is located at a first side of the substrate, and the second cavity is located at a second side of the substrate, where the first side of the substrate is opposite to the second side of the substrate.

8 Claims, 9 Drawing Sheets

(56) References Cited

U.S. PATENT DOCUMENTS

2015/0214200 A1 7/2015 Tan et al.
2016/0365257 A1 12/2016 Tan
2017/0110441 A1 4/2017 Tan

* cited by examiner

CHIP PACKAGING METHOD AND PACKAGE STRUCTURE

RELATED APPLICATIONS

This application claims the benefit of Chinese Patent Application No. 201710462318.5, filed on Jun. 19, 2017, which is incorporated herein by reference in its entirety.

FIELD OF THE INVENTION

The present invention generally relates to semiconductor technology, and more particularly to chip packaging methods and structures.

BACKGROUND

With increasing demand for miniaturization, thinness, and high integration of electronic components, there is a growing demand for semiconductor package area and package thickness reductions. Typical packaging methods utilize wire bonding technology, in order to achieve leading out of chip electrodes or input/output terminals. Although this type of packaging technology is mature and relatively easy to produce, the height of the wire can be significantly higher than the height of the chip, such that the thickness of the chip package is increased along with the package area. In order to reduce the thickness/area of the chip package, flip-chip packaging technology is widely used.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Flip-chip packaging technology may utilize conductive bumps on the chip and a metal layer under the bumps, which can result in a relatively complicated process. In addition, after the chip is electrically connected to the lead frame, a plastic encapsulation process may be utilized whether using wire bond or flip chip packaging. This is done in order to encapsulate the chip with a plastic material to form a plastic encapsulation body, but as a relatively complicated process. In addition, in order to increase integration of the chip packaging structure without increasing the area, multiple chips can be packaged in a stacked manner. However, whether the stacked package is realized by wire bonding technology or flip chip technology, reduction of the thickness of the stacked package structure may be limited due to the electrodes of the chip being led out using wires or bumps on the chip. In some stacked packages, the difficulty of the plastic encapsulation process may also be increased.

In particular embodiments, a chip packaging method can include forming a first cavity in a substrate, and then installing a first chip in the first cavity to form a chip packaging structure. After the first chip is installed, the remaining portion of the first chip can be encapsulated by the substrate except for the pins of the first chip being exposed on the surface of the substrate. In particular embodiments, the substrate may not only serve as a carrier of the first chip to provide mechanical support, but can also be used as a protective shell of the first chip in order to prevent external hot gas, water vapor, etc., from affecting the first chip. When a chip is packaged in certain embodiments, the plastic encapsulation process discussed above may not be required, and the electrodes on the chip can be led out to the surface of the package structure without using wire bonding or making conductive bumps on the chip.

Figure 1A:
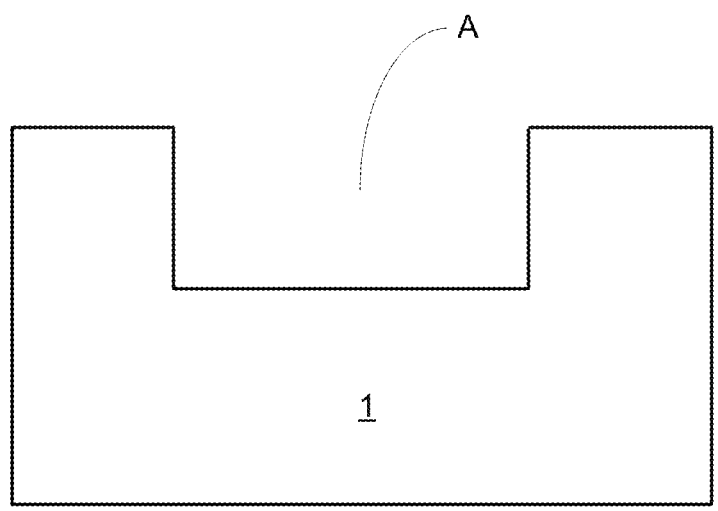
FIGS. 1A-1F are cross-sectional diagrams of various steps of a first example method of chip packaging, in accordance with embodiments of the present invention.

Referring now to FIGS. 1A-1F, shown are cross-sectional diagrams of various steps of a first example method of chip packaging, in accordance with embodiments of the present invention. In FIG. 1A, a first cavity can be formed in substrate 1. For example, a mechanical drilling technique or an etching (e.g., photolithography) technique may be utilized in order to open a first side surface of substrate 1 to form cavity A as shown. The depth and the width of cavity A can be respectively determined according to the thickness and the width of the chip that is to be subsequently installed therein. In this example, the subsequently installed chip is the "first" chip. If the thickness and width of the first chip are respectively h1 and d1, and the depth and width of cavity A are respectively h2 and d2, then $h2=h1+\Delta h$, and $d2=d1+\Delta d$, where $\Delta h$ and $\Delta d$ both are predetermined values. For example, $\Delta h$ can be set to a value from about 0 to about 60 μm, such as about 10 μm, and $\Delta d$ can be set to a value from about 0 to about 300 μm, such as about 100 μm.

In particular embodiments, a material having a large elastic modulus (e.g., Bismaleimide-Triazine resin [BT]) may be selected as a forming material of substrate 1, and the thickness of the substrate may be determined according to the thickness of the chip to be installed therein. As shown in FIG. 1C, the first chip (e.g., 3) can be installed in cavity A. For example, installing the chip in cavity A may include placing chip 3 in cavity A as with its active surface facing upward. That is, the back of chip 3 (the side opposite to the active surface) can be close to the bottom of cavity A. Before being placed in cavity A, chip 3 may be back-ground in order to reduce its thickness. Cavity A can be filled with buffer material 4 after chip 3 is placed. That is, the remaining space in the entire first cavity except for chip 3 may be filled with buffer material 4.

Figure 1B:
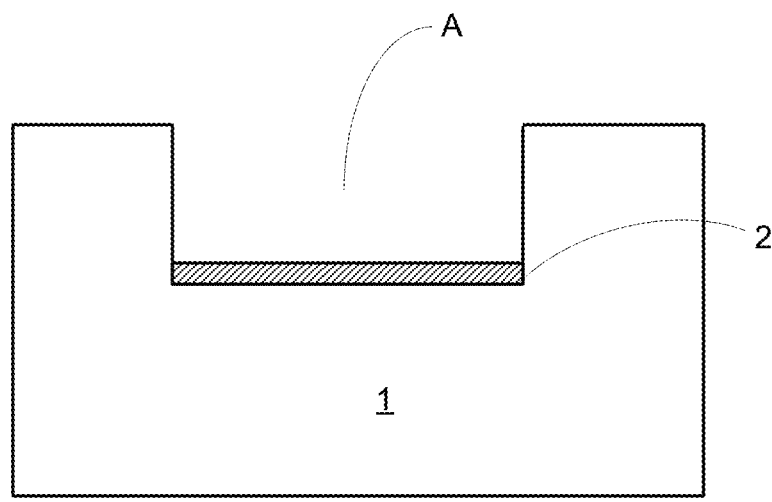
Figure 1C:
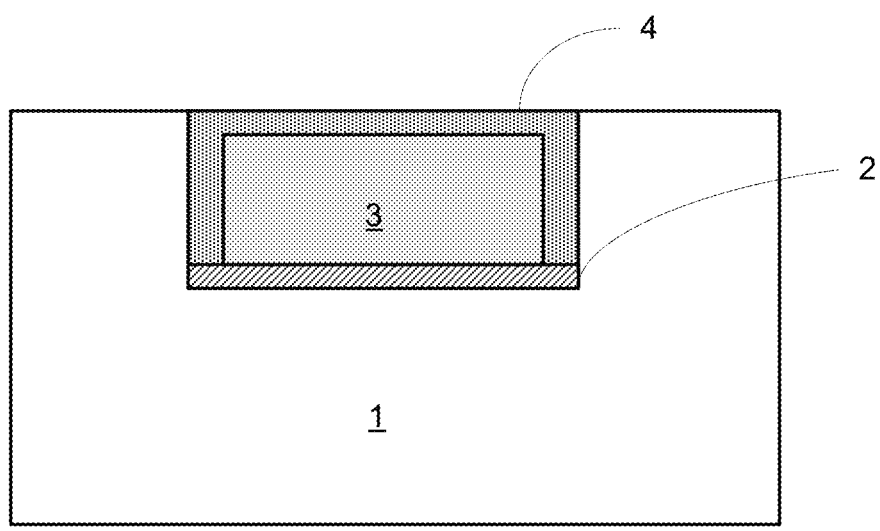
Figure 1D:
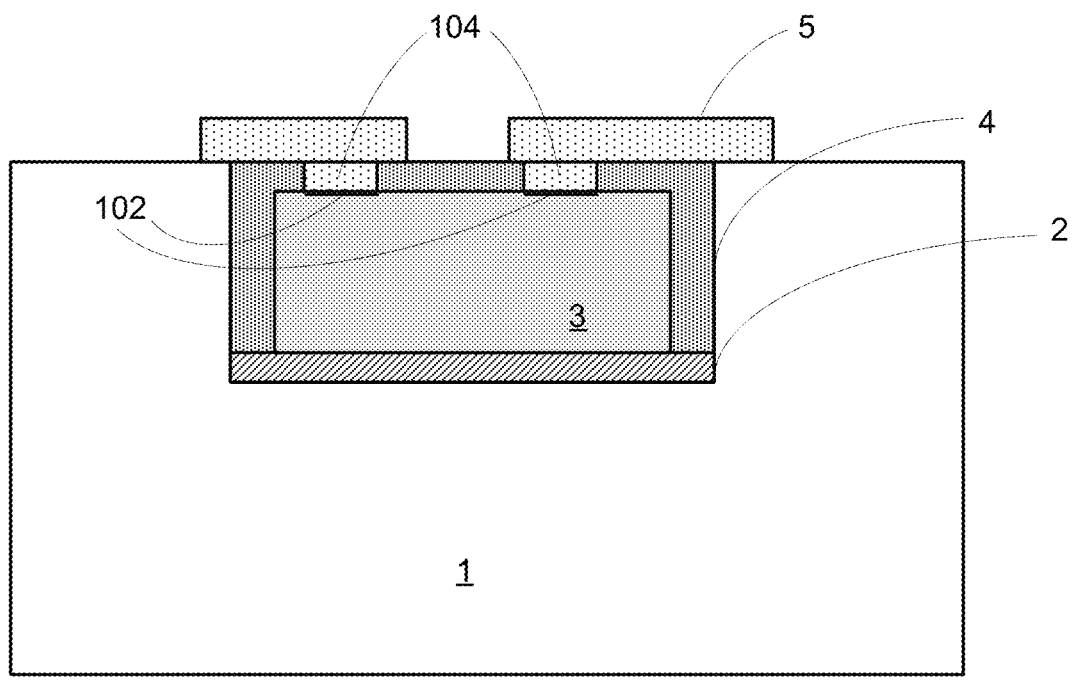

As shown in FIG. 1D, the electrodes of chip 3 can be to the surface of substrate 1 to form pins 5. Before forming pins 5, the electrode pads (e.g., 102) on chip 3 can be exposed by buffer material 4. When buffer material 4 is filled, buffer material 4 can cover the entire active surface of chip 3. After filling buffer material 4, buffer material 4 that is located on the active surface of chip 3 can undergo an opening process. For example, a laser opening technology may be employed for opening in order to expose the electrode pads. Another way for exposing the electrode pads by buffer material 4 is by covering the active surface of chip 3 with a mask before filling buffer material 4. The mask pattern and the patterns of the electrode pads on chip 3 may be complementary such that the mask can block the electrode pads on chip 3 and expose remaining portions of the active surface of chip 3 except for the electrode pads. After covering the mask, buffer material 4 may be filled such that buffer material 4 covers remaining portions of the active surface of chip 3 except the electrode pads, and exposes the electrode pads.

After the electrode pads are exposed by buffer material 4, the pin mask can be disposed on buffer material 4, such that the electrode pads are exposed at the opening of the pin mask. A sputtering and electroplating process may be performed at the opening of the pin mask in order to form pins 5 that are electrically connected to the electrode pads. Pins 5 can include a first portion (e.g., electrode 104) extending in the opening from the surface of substrate 1 to the electrode pads (e.g., 102), and a second portion electrically connecting to the first portion of pins 5 and extending on the surface of substrate 1. For example, the pin mask can be formed by a photolithography process. Since the thickness of buffer material 4 covering chip 3 is reduced in this way, it can be less than the thickness of a conductive bump in other approaches. That is, the thickness of the first portion of pins 5 is reduced, such that the chip packaging structure formed in particular embodiments may have a smaller thickness than a standard flip chip packaging structure.

In addition, as shown in FIG. 1B, in order to prevent chip 3 from being damaged during the placing of chip 3 in cavity A, buffer layer 2 may be at the bottom of cavity A prior to placing chip 3 in cavity A. For example, the thickness of buffer layer 2 may be set to from about 0 to about 30 μm, such as about 10 μm. In addition, a material having a smaller elastic modulus than that of substrate 1 can be utilized as a forming material of buffer layer 2.

Figure 1E:
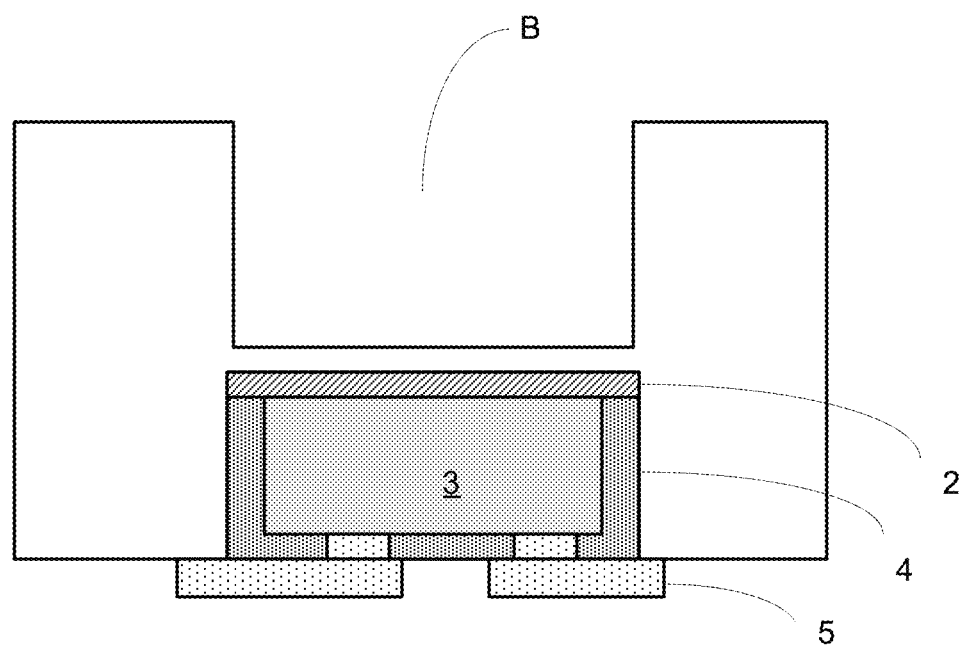

As shown in FIG. 1E, a second cavity may formed be in substrate 1. If cavity A is located at the "first" side of substrate 1, cavity B may be located at the "second" side of substrate 1 in order to reduce the area of the chip packaging structure. The first and second sides of substrate 1 are opposite sides. Cavity B may be formed in a substantially same manner as that of cavity A. Similarly, the depth and width of cavity B may also be determined by the thickness and width of a "second" chip that is to be subsequently be installed therein. In order to minimize the thickness of the chip packaging structure, the distance between the first and second cavities may be set to be as small as possible. For example, when substrate 1 is opened by mechanical drilling or etching to form cavity B, buffer layer 2 can be exposed by the opening. In this way, the distance between the first and second cavities can be almost zero, which can minimize the overall thickness of the chip packaging structure.

Figure 1F:
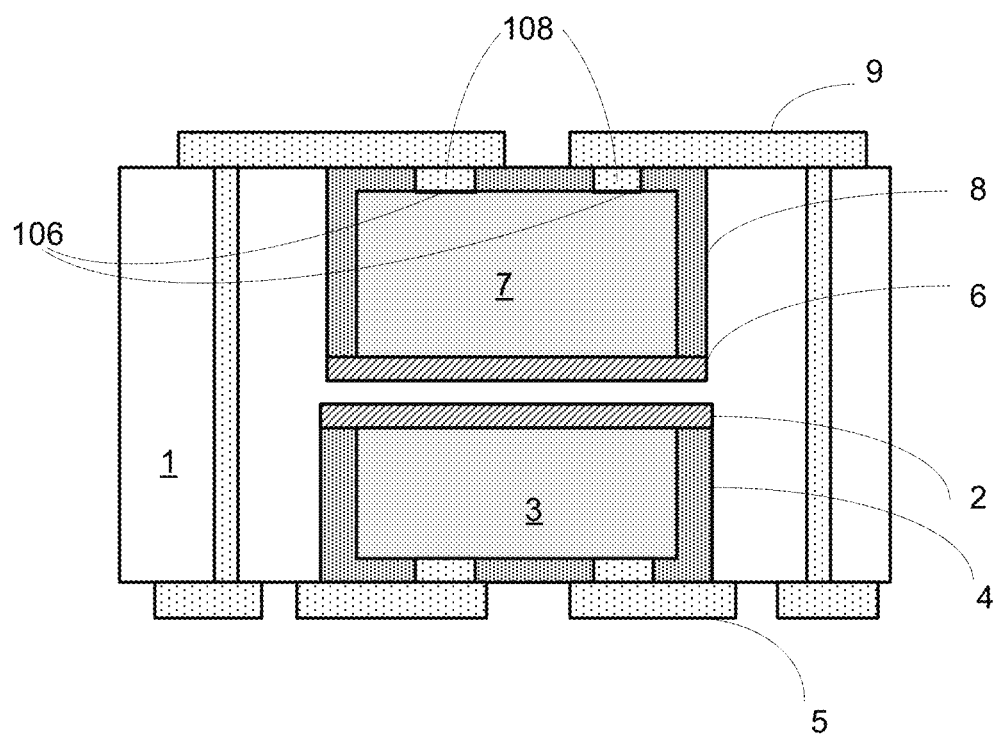

As shown in FIG. 1F, chip 7 may be installed in cavity B as shown in FIG. 1F. Chip 7 can be installed in cavity B in a substantially similar manner as that of chip 3 in cavity A. Thus, chip 7 can be in cavity B in substantially the same manner as that of placing chip 3 in cavity A. Also, cavity B can be filled by chip 7 being placed on buffer layer 6 and surrounded with buffer material 8. Buffer materials 4 and 8 may be the same, and filling cavity B with buffer material 8 can be performed in substantially the same manner as filling cavity A with buffer material 4. In addition, the electrodes of chip 7 can be led out to the surface of substrate 1 to form pins 9.

In this particular example, cavity A is located at the first side of substrate 1, and cavity B is located at the second side of substrate 1. The electrodes (e.g., 108) of chip 7 can be led out to the surface of the second side of substrate 1 to form pins 9, and the electrodes of chip 3 can be led out to the surface of the first side of substrate 1 to form pins 5. That is, the soldering surfaces of pins 5 and 9 (e.g., surfaces electrically connected to external circuitry) may be respectively located on the opposite two side surfaces of substrate 1. In this case, forming pins 9 can be formed in substantially the same manner as that of pins 5. Also, pins 9 can include a first portion (e.g., electrodes 108) extending in the opening from the electrode pads (e.g., 106) of chip 7 to the surface of the second side of substrate 1, and a second portion on the surface of the second side of substrate 1.

In some cases, the soldering surface of pins 9 and the soldering surface of pins 5 may be located on the same side of substrate 1 (e.g., all on the surface of first side of substrate 1). In such a case, pins 9 may further include a third portion extending from the surface of the second side of substrate 1 to the surface of the first side of substrate 1, and a fourth portion located on the surface of the first side of substrate 1. Then, the surface of the second portion of pins 5, and the surface of the fourth portion of pins 9, may serve as respective soldering surfaces.

Figure 2A:
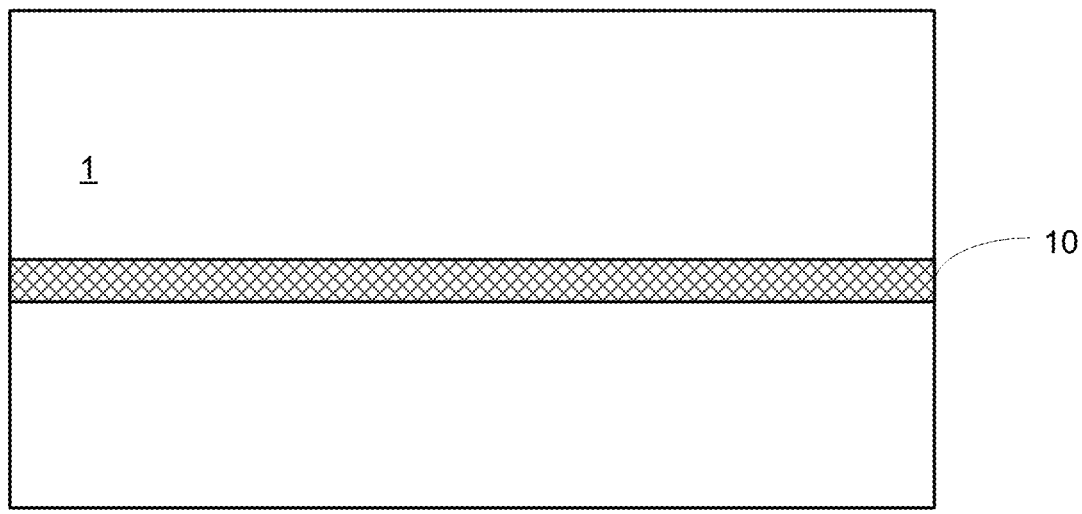
FIGS. 2A-2C are cross-sectional diagrams of various steps of a second example method of chip packaging, in accordance with embodiments of the present invention.
Figure 2B:
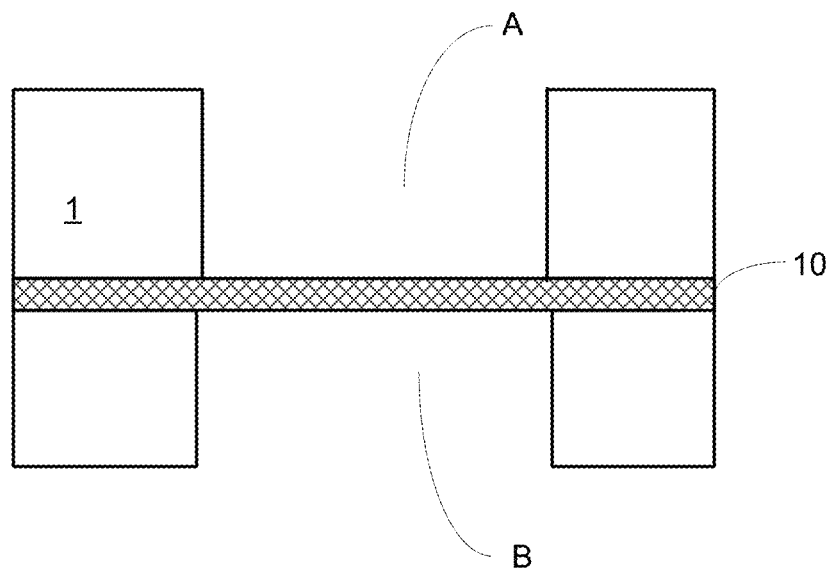
Figure 2C:
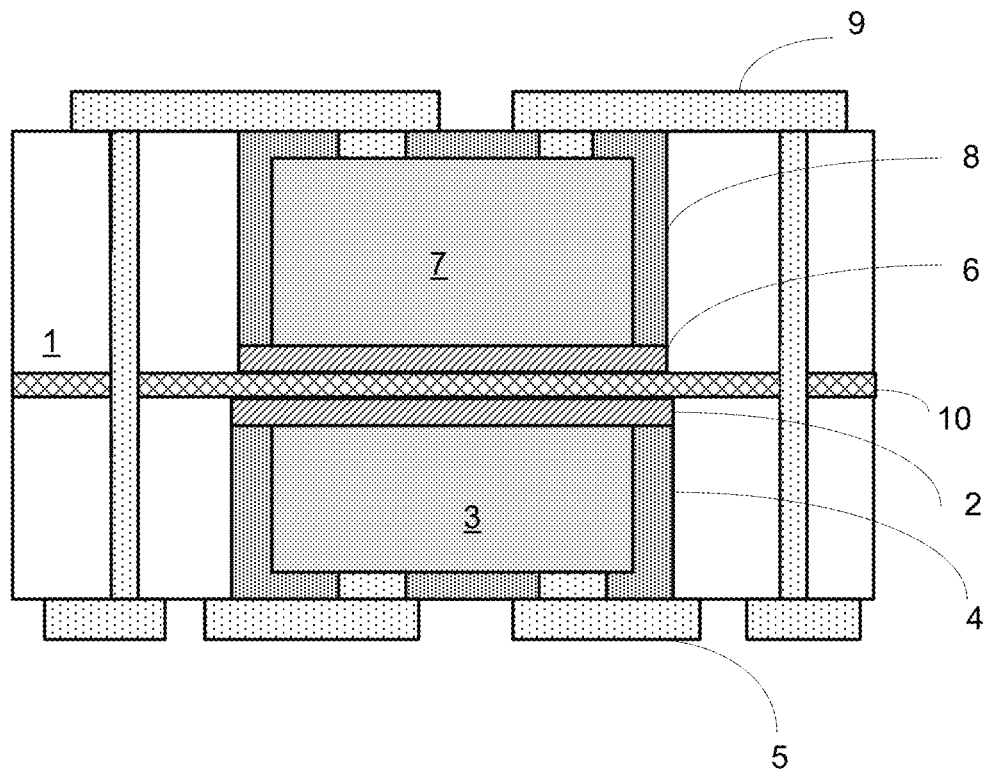

Referring now to FIGS. 2A-2C, shown are cross-sectional diagrams of various steps of a second example method of chip packaging, in accordance with embodiments of the present invention. In this particular example, thermally conductive layer 10 may be formed in substrate 1 before cavity A is formed. As shown in FIG. 2A, thermally conductive layer 10 may be a laminate plate that is sandwiched between the main materials forming substrate 1. In addition, as shown in FIG. 2B, after cavity A is formed on the first side of substrate 1, chip 3 may not be installed prior to cavity B being formed on the second side of substrate 1. When cavity A is formed, cavity A can expose a portion of thermally conductive layer 10 such that thermally conductive layer 10 is adjacent to cavity A, in order to serve as a heat-dissipating layer of chip 3 to be subsequently installed in cavity A.

Similarly, when forming cavity B, cavity B may also expose a portion of thermally conductive layer 10 such that thermally conductive layer 10 is adjacent to cavity B in order to serve as a heat-dissipating layer of chip 7 to be subsequently installed in cavity B. After cavities A and B are formed, chips 3 and 7 may respectively be installed in cavities A and B, as discussed above. In this particular example, in order to facilitate the heat dissipation of chips 3 and 7, buffer layers 2 and 6 may be both configured as thermally conductive adhesives, as shown in FIG. 2C. The heat generated from chips 3 and 7 may be transferred to thermally conductive layer 10 through the respective thermally conductive adhesives. Thermally conductive layer 10 can extend along the horizontal direction of the stack of chips 3 and 7 in order to expose the sides of substrate 1, thereby emitting the heat from the package structure.

Particular embodiments may also include a chip packaging structure, having a substrate with a first cavity and a first chip installed therein in addition, the substrate may have a second cavity in which a second chip is installed therein. As shown in FIGS. 1F and 2C, in the chip packaging structure, cavities A and B are respectively located at the first and second sides of substrate 1, where the first and second sides of substrate 1 are opposite. The chip packaging structure can also include pins 5 electrically connected to the electrode pads of chip 3, pins 9 electrically connected to the electrode pads of chip 7, buffer layer 2 at the bottom of cavity A, buffer layer 6 at the bottom of cavity B, buffer material 4 filled in cavity A, and buffer material 8 filled in cavity B. For example, pins 5 and 9 may be respectively located on the same side surface of substrate 1, or on the opposite two sides of substrate 1. In order to facilitate heat dissipation of the chip in substrate 1, thermally conductive layer 10 can also be provided in substrate 1, and thermally conductive layer 10 can be respectively adjacent to cavities A and B in order to serve as the heat dissipation layer of chips 3 and 7.

In this way, a cavity can be formed in a substrate, and then a chip may be in the cavity. The substrate may encapsulate the installed chip as a protective shell of the installed chip, such that plastic encapsulation processes need not be utilized to form a plastic encapsulation body for protecting the chip. This can effectively simplify the process complexity of the chip packaging structure. In addition, the substrate may also serve as a carrier for the installed chip, such that the chip may not need to be installed on a preformed lead frame. Further, in the process of leading out the chip electrodes, there may be no need to use wires bonding or conductive bumps on the chip. This may not only further simplify the packaging process, but can also effectively reduce the thickness of the overall chip packaging structure.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of forming a chip package structure, the method comprising:
    a) forming a substrate;
    b) forming a first cavity in said substrate;
    c) placing a first chip in said first cavity;
    d) filling said first cavity in which said first chip is placed with a buffer material;
    e) exposing electrode pads of said first chip by forming an opening in said buffer material;
    f) performing a sputtering and electroplating at said opening to form electrodes of said first chip from said electrode pads to the surface of said substrate; and
    g) forming first pins comprising said electrodes to lead out from said electrode pads of said first chip.

2. The method of claim 1, further comprising forming a buffer layer on a bottom surface of said first cavity prior to placing said first chip in said first cavity.

3. The method of claim 1, further comprising:
    a) forming a second cavity in said substrate; and
    b) installing a second chip in said second cavity.

4. The method of claim 3, wherein said first cavity is located at a first side of said substrate, said second cavity is located at a second side of said substrate, and said first side of said substrate is opposite to said second side of said substrate.

5. The method of claim 4, wherein said installing said second chip in said second cavity comprises:
    a) placing said second chip in said second cavity;
    b) filling said second cavity by a buffer material;
    c) exposing electrode pads of said second chip by forming an opening in said buffer material;
    d) performing a sputtering and electroplating at said opening to form electrodes of said second chip from said electrode pads to the surface of said substrate; and
    e) forming second pins comprising said electrodes to lead out from said electrode pads of said second chip.

6. The method of claim 5, wherein after said forming of said second pins, each of said second pins comprises:
    a) a first portion extending from electrode pads of said second chip to said second side surface of said substrate;
    b) a second portion located on said second side surface of the substrate;
    c) a third portion extending from said second side surface of said substrate to said first side surface of said substrate; and
    d) a fourth portion located on said first side surface of said substrate.

7. The method of claim 1, wherein said forming said first cavity comprises mechanical drilling.

8. The method of claim 1, wherein said forming said first cavity comprises etching.

* * * * *